US012755799B2

(12) United States Patent
Qiu

(10) Patent No.: US 12,755,799 B2
(45) Date of Patent: Oct. 6, 2026

(54) NONVOLATILE MEMORY WITH SELF-TRACKING $I_{REF}$

(71) Applicant: TEXAS INSTRUMENTS INCORPORATED, Dallas, TX (US)

(72) Inventor: Yunchen Qiu, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 603 days.

(21) Appl. No.: 17/854,407

(22) Filed: Jun. 30, 2022

(65) Prior Publication Data

US 2024/0006000 A1 Jan. 4, 2024

(51) Int. Cl.

*G11C 16/28* (2006.01)
*G11C 16/30* (2006.01)
*H10B 41/00* (2023.01)
*G11C 16/04* (2006.01)

(52) U.S. Cl.

CPC .............. *G11C 16/28* (2013.01); *G11C 16/30* (2013.01); *H10B 41/00* (2023.02); *G11C 16/0433* (2013.01)

(58) Field of Classification Search

CPC ..... G11C 16/28; G11C 16/30; G11C 16/0433; G11C 7/062; G11C 7/14; G11C 16/24; H10B 41/00

USPC .................................................... 365/185.21

See application file for complete search history.

(56) References Cited

U.S. PATENT DOCUMENTS

| | | | | |
|---|---|---|---|---|
| 2019/0279709 | A1* | 9/2019 | Lee | G11C 29/028 |
| 2020/0117836 | A1* | 4/2020 | Garbe | G06F 21/79 |
| 2021/0350860 | A1* | 11/2021 | Yang | G11C 16/349 |
| 2021/0375333 | A1* | 12/2021 | Rana | G11C 7/06 |

* cited by examiner

*Primary Examiner* — Fernando Hidalgo

(74) *Attorney, Agent, or Firm* — Andrew R. Ralston; Frank D. Cimino

(57) ABSTRACT

A nonvolatile memory (NVM) device having a programmable, self-tracking reference current design and a method of fabricating the same. A differential reference cell corresponding to a particular wordline is operable to generate a total reference cell current comprising an ON current and an OFF current driven by respective reference memory cells that form the differential reference cell. A reference current generator is operable to provide a scalable fraction of the total reference cell current as a reference current ($I_{REF}$) for facilitating sensing operations by a sense amplifier block.

20 Claims, 10 Drawing Sheets

NONVOLATILE MEMORY WITH SELF-TRACKING $I_{REF}$

FIELD OF THE DISCLOSURE

Disclosed implementations relate generally to the field of semiconductor memory and fabrication. More particularly, but not exclusively, the disclosed implementations relate to nonvolatile memory having a self-tracking reference current ($I_{REF}$) design.

BACKGROUND

A non-volatile-memory bitcell is an electronic element that is configured to store information. A threshold voltage can be used to discriminate between logic levels of the bitcell, such as a logic low level ("0") or a logic high level ("1"). This stored value may sometimes be referred to as information (or a bit). In some implementations, sense amplifier circuitry that performs the discrimination based on a reference current ($I_{REF}$) may be used in reading the information stored in the bitcell.

SUMMARY

The following presents a simplified summary in order to provide a basic understanding of some examples of the present disclosure. This summary is not an extensive overview of the examples, and is neither intended to identify key or critical elements of the examples, nor to delineate the scope thereof. Rather, the primary purpose of the summary is to present some concepts of the present disclosure in a simplified form as a prelude to a more detailed description that is presented in subsequent sections further below.

Examples of the present disclosure are directed to a nonvolatile memory (NVM) device having a programmable, self-tracking $I_{REF}$ design and a method of fabricating the same. A differential reference cell corresponding to a wordline of the NVM device is operable to generate a total reference cell current comprising an ON reference current and an OFF reference current driven by respective reference memory cells that form the differential reference cell. A reference current generator is operable to provide a scalable fraction of the total reference cell current as a reference current ($I_{REF}$) for facilitating sensing operations by a sense amplifier.

In one example, an integrated circuit (IC) comprising a memory array including a plurality of bitcells is disclosed, wherein the plurality of bitlines are addressable by wordlines and array bitlines. The IC includes a differential reference cell electrically connected to a corresponding one of the wordlines, the differential reference cell comprising a first reference memory cell and a second reference memory cell, the first reference memory cell operable to produce a first current and the second reference memory cell operable to produce a second current. The IC also includes a reference current generator configured to receive the first and second currents via respective first and second current paths and to output a reference current that is a fraction less than unity of a sum of the first current and the second current. In one arrangement, the IC further includes a differential sense amplifier configured to receive the reference current and a bit current corresponding to a selected one of the bitcells, and to output a read bit value corresponding to the selected one of the bitcells in response to the reference current and the bit current. In one arrangement, the first and second currents are based on respective electrical states of the first and second reference memory cells of the differential reference cell. In one arrangement, the first current may comprise an ON reference current (e.g., a current generated when the first reference memory cell is in a conducting state) and the second current may comprise an OFF reference current (e.g., a current generated when the second reference memory cell is in a non-conducting state). In another arrangement, the first and second currents may comprise OFF and ON reference currents, respectively. In another arrangement, the first and second may alternately comprise ON and OFF reference currents, respectively, based on the electrical states of the first and second reference memory cells that may be dynamically programmed to track the erase/program cycles of the memory array.

In one example, a method of fabricating an IC device including a nonvolatile memory is disclosed. The method may comprises, inter alia, forming a memory array over a semiconductor substrate, the memory array including a plurality of bitcells addressable by wordlines and array bitlines; forming a differential reference cell over the semiconductor substrate, the differential reference cell electrically connected to a corresponding one of the wordlines, the differential reference cell comprising a first reference memory cell and a second memory reference cell, the first reference memory cell operable to produce a first current and the second reference memory cell operable to produce a second current; forming a reference current generator over the semiconductor substrate, the reference current generator configured to receive the first and second currents via respective first and second current paths and to output a reference current that is a fraction less than unity of a sum comprising a sum of the first current and the second current; and forming a differential sense amplifier over the semiconductor substrate, the differential sense amplifier configured to receive the reference current and a bit current corresponding to a selected one of the bitcells, and to output a read bit value corresponding to the selected one of the bitcells in response to the reference current and the bit current.

In one arrangement, an example reference current generator may be formed to include a current mirror block configured to output the reference current as one-half of the sum of the first current and the second current. In one arrangement, the plurality of bitcells and the differential reference cell may be formed from PMOS devices. In another arrangement, the plurality of bitcells and the differential reference cell may be formed from NMOS devices. In one arrangement, the plurality of bitcells and the first and second reference memory cells are each formed to comprise a corresponding floating gate storage device coupled in series with a wordline select device. In one arrangement, an example differential reference cell may be formed to include first and second reference memory cells operable to alternate between programmed and unprogrammed states for each erase and program cycle applied to at least a proper subset of the bitcells that are connected to the corresponding one of the wordlines. In one arrangement, the first and second reference memory cells and the bitcells connected to the corresponding wordline may be formed contemporaneously in a same fabrication operation so that the reference memory cells and the bitcells connected to the corresponding wordline experience and/or encounter the same process corners and conditions, which facilitates better tracking of read current distributions over the life of the IC device.

BRIEF DESCRIPTION OF DRAWINGS

Implementations of the present disclosure are illustrated by way of example, and not by way of limitation, in the Figures of the accompanying drawings. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described.

The accompanying drawings are incorporated into and form a part of the specification to illustrate one or more example implementations of the present disclosure. Various advantages and features of the disclosure will be understood from the following Detailed Description taken in connection with the appended claims and with reference to the attached drawing Figures in which:

DETAILED DESCRIPTION

Figure 1:
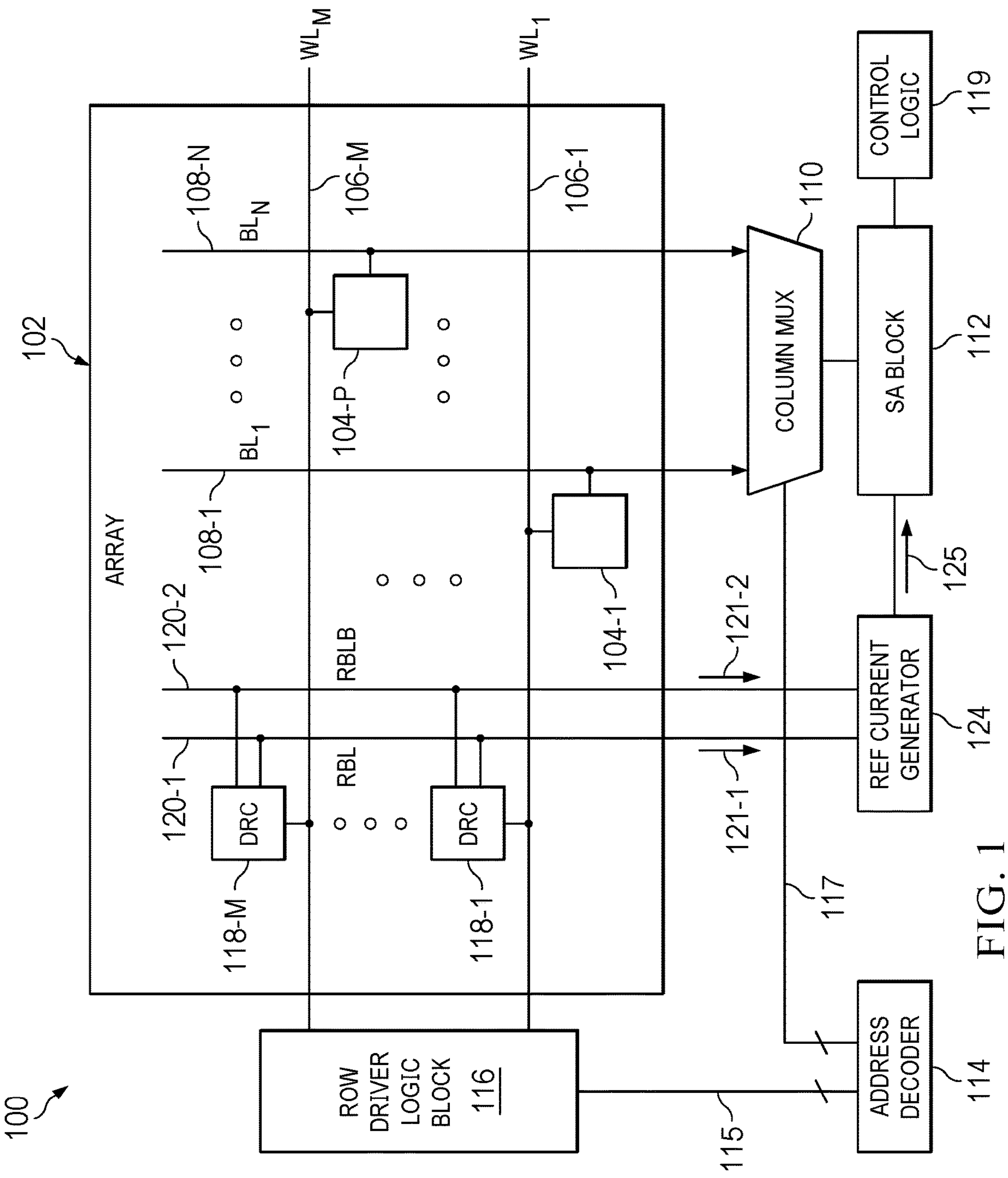
FIG. 1 depicts a block diagram of a nonvolatile memory having a differential reference cell arrangement for providing a programmable, self-tracking reference current ($I_{REF}$) according to some examples of the present disclosure.

Examples of the disclosure are described with reference to the attached Figures wherein like reference numerals are generally utilized to refer to like elements. The Figures are not drawn to scale and they are provided merely to illustrate examples. Numerous specific details, relationships, and methods are set forth below to provide an understanding of one or more examples. However, it should be understood that some examples may be practiced without such specific details. In other instances, well-known circuits, subsystems, components, structures and techniques have not been shown in detail in order not to obscure the understanding of the examples. Accordingly, it will be appreciated by one skilled in the art that the examples of the present disclosure may be practiced without such specific components.

Additionally, terms such as "coupled" and "connected," along with their derivatives, may be used in the following description, claims, or both. It should be understood that these terms are not necessarily intended as synonyms for each other. "Coupled" may be used to indicate that two or more elements, which may or may not be in direct physical or electrical contact with each other, co-operate or interact with each other. "Connected" may be used to indicate the establishment of communication, i.e., a communicative relationship, between two or more elements that are coupled with each other. Further, in one or more examples set forth herein, generally speaking, an element, component or module may be configured to perform a function if the element may be programmed for performing or otherwise structurally arranged to perform that function.

Without limitation, examples of a programmable reference current generation scheme will be set forth below in the context of a generalized nonvolatile memory architecture.

Various disclosed methods and devices of the present disclosure may be beneficially applied to integrated circuits that include a nonvolatile memory array to adjust a threshold for determining a logic state of bitcells in the array over the life of the memory array. While such embodiments may be expected to provide improvements in performance, such as improved read reliability over the life of the array, no particular result is a requirement of the present invention unless explicitly recited in a particular claim.

Nonvolatile memory is a storage medium that may store information in an array of memory cells, also referred to as bitcells, which retain the information even after power is removed. This stored information (or "bits") can be electrically erased, programmed, and read. In some cases, an array of floating-gate transistor bitcells may be used in creating an NVM circuit, often referred to as a macro, which may be deployed in a variety of applications, e.g., System on a Chip (SoC) applications, embedded memory applications, or standalone memory applications, etc. A floating-gate transistor bitcell resembles a standard metal-oxide-field-effect-transistor (MOSFET) except that the floating-gate transistor bitcell includes multiple gates (e.g., a control gate overlying an electrically isolated floating gate). An electrical state of a bitcell can be used to define a logic level such as a logic low level (e.g., a digital low or "0") or a logic high level (e.g., digital high or "1") depending on the Boolean logic used by sense circuitry for reading the data in a read operation. This defined logic level may sometimes be referred to as information (or a bit) stored in the bitcell.

Storage of information may be effectuated using changes in the floating gate characteristics of the bitcells. The threshold voltage ($V_T$) of a floating-gate type transistor bitcell may change because of the presence or absence of a charge trapped in its floating gate due to electrical isolation. The trapped charge alters the threshold voltage (relative to the unchanged threshold voltage) of the floating-gate transistor bitcell. For instance, in an example NMOS-based NVM implementation, the threshold voltage is increased when electrons are trapped in the floating gate (FG) of the bitcell (e.g., a "programmed" bitcell). On the other hand, the threshold voltage is decreased when electrons are depleted in the floating gate of an NMOS bitcell (e.g., an "erased" bitcell). Accordingly, when a voltage is applied to the control gate of a bitcell of an NMOS-based NVM array during the read operation, the bitcell is conductive in an erased state and nonconductive in a programmed state, wherein each state is operative for generating a corresponding read current (IREAD) that is provided to a sense amplifier for sensing the data. In an example arrangement, the sense amplifier may be configured to determine the data relative to another current, referred to as a reference current ($I_{REF}$). In PMOS-based NVM, these relationships are opposite, in that the PMOS bitcells are conductive in programmed state and non-conducting in erased state. In general, regardless of whether PMOS-based or NMOS-based NVM is implemented, a read current generated when the bitcell is conducting may be referred to as "ON" read current ($I_{ON}$) and a read current generated when the bitcell is non-conducting may be referred to as "OFF" read current ($I_{OFF}$). In an example arrangement, $I_{ON}$ and $I_{OFF}$ read currents may have respective distributions sufficiently separated with respect to the reference current so that the likelihood of false data reads in an NVM device may be reduced at least in the Beginning of Life (BOL) stages of the device. Several factors may affect the bitcell $I_{ON}$ and $I_{OFF}$ read currents of an NVM device over its life, e.g., including but not limited to: the process corners of a fabrication flow deployed for manufacturing the device, erase/program conditions (e.g., time, voltages, etc.) used in bitcell erase and programming operations, the number of erase/program cycles as well as the number of read cycles during the lifetime of the device, operating voltages, and the like. Further, parametric changes may also occur over time from BOL stages to End of Life (EOL) stages of the device due to, e.g., positive bias temperature instability (PBTI), negative bias temperature instability (NBTI), aging/temperature effects, etc., which can also affect the bitcell read currents. Accordingly, the read currents of an NVM device can vary over its lifetime, potentially shrinking the separation between the $I_{ON}$ and $I_{OFF}$ distributions, and even leading to overlapping in some instances. Such deteriorating conditions can potentially reduce the capability of a sense amplifier that operates based on a fixed or static reference current to correctly sense the data during read operations.

Example implementations are directed to a reference current design based on a differential reference cell arrangement that may be configured to provide a reference current that can vary over time in order to better track the variability of bitcell $I_{ON}$ and/or $I_{OFF}$ read current distributions of an NVM device over its life under various operating conditions. Examples of the present disclosure may therefore be particularly advantageous in facilitating and maintaining satisfactory read performance from BOL to EOL stages of the device. In some arrangements, the differential reference cells implemented in a reference current design may be configured to be dynamically programmable with alternating electrical states so as to reduce the likelihood of the reference cells becoming inured to the operating conditions over time.

Turning to FIG. 1, depicted therein is a block diagram of an NVM device 100 having a differential reference cell arrangement for providing a programmable, self-tracking reference current ($I_{REF}$) according to some examples of the present disclosure. A plurality of memory cells or bitcells 104-1 to 104-P may be organized into a bitcell array 102 having a plurality of rows or wordlines 106-1 to 106-M and a plurality of columns or array bitlines 108-1 to 108-N, wherein a bitcell is disposed at each intersection of the wordlines and bitlines. Herein an "array bitline" is a bitline configured to address one or more of the bitcells 104-1 to 104-P, e.g., those bitcells associated with the memory storage operation of the NVM device 100. The bitcells 104-1 to 104-P are addressable by the wordlines 106-1 to 106-M and the bitlines 108-1 to 108-N. By way of illustration, bitcell 104-1 is disposed at the intersection of wordline 106-1 and bitline 108-1, wherein bitcell 104-P may be appropriately coupled to wordline 106-M and bitline 108-N at respective nodes depending on the internal cell architecture of the bitcell as will be set forth further below. In an example arrangement, bitlines 108-1 to 108-N may be coupled to a sense amplifier block 112 via a column multiplexer (mux) 110 that may be implementation- and architecture-specific. An address decoder block 114 is operable for decoding row and column addresses with respect to one or more memory cells selected during erase/program/read operations as is known in the relevant art. Decoded row address signals 115 and decoded column address signals 117 may be provided to row driver logic block 116 and column mux 110, respectively, for selectively activating corresponding wordlines and bitlines with respect to the selected memory operations. In a read operation, for example, a voltage may be placed on the control gate of a selected bitcell by driving the associated wordline to a suitable logic level. Depending on whether the bitcell is conducting or non-conducting, a corresponding read current may be developed on the selected bitline, which may be provided to a sense amplifier of sense amplifier block 112 via a conductive path through column mux circuitry 110. A control logic block 119 may be provided in association with sense amplifier block 112 for facilitating, among others, configuring sense amplifier circuitry for the selected memory operations, buffering/latching of output data in a read operation, etc.

Depending on implementation, sense amplifier block 112 may comprise a plurality of differential sense amplifiers, wherein a sense amplifier may be configured to receive a read current from a selected bitline and a reference current from a reference current generator 124. In one example arrangement, a block of differential reference cells 118-1 to 118-M may be provided as part of NVM device 100, wherein each differential reference cell (DRC) is associated with a corresponding wordline 106-1 to 106-M and may include a pair of reference memory cells (e.g., a first reference memory cell and a second reference memory cell, not specifically shown in this FIG.) that are fabricated in the same fabrication stages as the bitcells forming the corresponding wordline 106-1 to 106-M. In one example arrangement, the reference memory cells of a DRC may be configured to be identical to the bitcells of bitcell array 102. By placing DRC elements 118-1 to 118-M proximate to respective wordlines and fabricated along with the array bitcells, the reference memory cells of DRC elements 118-1 to 118-M may be configured to experience the same processing corners, variations, conditions, etc. as the array bitcells. Additionally, as will be set forth further below, because the read operations of the bitcells are tied with the operations of corresponding DRC elements 118-1 to 118-M, the reference memory cells of DRC elements 118-1 to 118-M are designed to encounter the same operational conditions as the array bitcells over the life of NVM device 100. Accordingly, DRC elements 118-1 to 118-M are particularly adapted to track the temporal variations of parameters and operational conditions of the array bitcells in a more realistic manner, whereby the generation of a reference current that can vary in accordance with the variations of $I_{ON}$ and $I_{OFF}$ read current distributions may be facilitated in an example implementation.

In an example arrangement, a pair of reference bitlines, e.g., a first reference bitline RBL 120-1 and a second reference bitline $\overline{RBL}$ 120-2, are respectively coupled to DRC elements 118-1 to 118-M. The reference bitline RBL 120-1 and the reference bitline $\overline{RBL}$ 120-2 are current paths operable to carry respective currents $I_1$ 121-1 and $I_2$ 121-2 generated by first and second reference memory cells of a DRC element associated with a corresponding wordline selected in a read operation. As will be set forth in additional detail further below, first and second reference memory cells of a DRC element may be configured to operate in complementary fashion, e.g., one reference memory cell is in a conducting state while the other reference memory cell is a non-conducting state, wherein respective currents 121-1, 121-2 are provided to reference current generator 124, which may be configured to provide a ratio of a total reference current ($I_{TOTAL}=I_1+I_2$) as a reference current 125 to a sense amplifier associated with the selected bitline. In an example arrangement, reference current generator 124 may be implemented using a combination of known and/or heretofore unknown current adder circuitry and current mirroring circuitry to obtain a scalable fraction of $I_{TOTAL}$ (e.g., ½, ⅔, ⅘, etc.) as the reference current that may be optimized for different skew ratios in order to facilitate better tracking with respect to any $I_{ON}$ and/or $I_{OFF}$ distributions that may occur over the lifecycle of NVM device 100.

Figure 8:
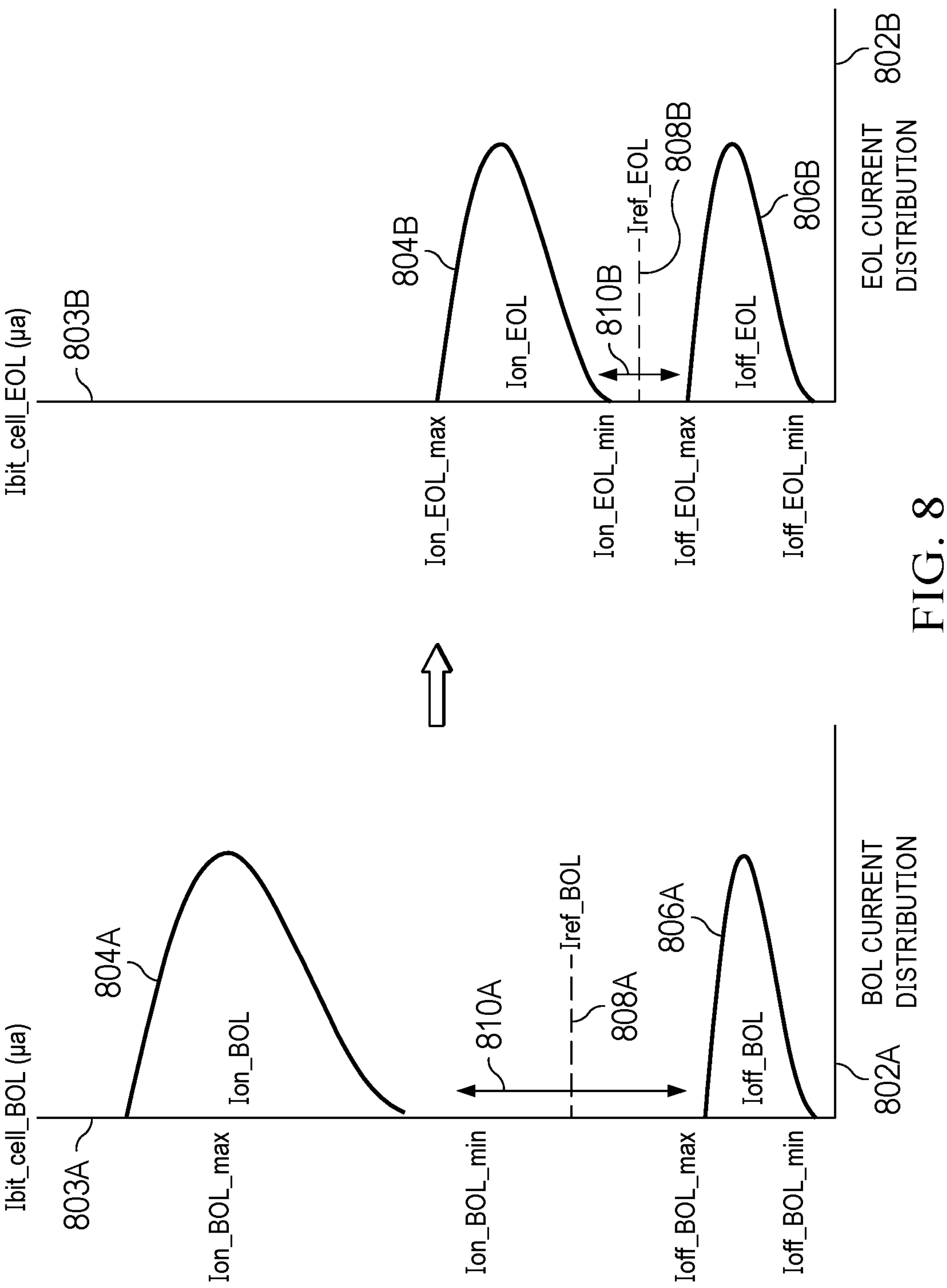
FIG. 8 depicts Beginning of Life (BOL) and End of Life (EOL) read current distributions corresponding to different logic states of memory cells in an EEPROM array wherein $I_{REF}$ may be varied over time according to some examples of the present disclosure.

FIG. 8 depicts representative $I_{ON}$ and $I_{OFF}$ current distributions at different life stages of an example IC device having NVM where self-tracking $I_{REF}$ may be varied over time according to some examples of the present disclosure. BOL graph 802A is illustrative of a panel of bitcell current ($I_{BIT\text{-}CELL}$) distributions at a BOL stage of the device, wherein both $I_{ON}$ current distribution 804A and $I_{OFF}$ current distribution 806A are shown along a common current axis 803A (not drawn to scale) as respective distributions (e.g., in μA) that are separated by a current gap 810A. In one arrangement, $I_{ON}$ and $I_{OFF}$ current distributions 804A, 806A may comprise normal distributions, skewed distributions, etc., with respective means, ranges, variances/standard deviations, and the like, although other types of current distributions are also possible. In one arrangement, a reference current generator of the present disclosure may be configured to generate an $I_{REF}$ 808A at BOL stage that may be generally in the middle of current gap 810A. EOL graph 802B is illustrative of a panel of $I_{BIT\text{-}CELL}$ current distributions at an EOL stage of the device, wherein both $I_{ON}$ current distribution 804B and $I_{OFF}$ current distribution 806B after the passage of time are shown along a common current axis 803B (not drawn to scale). As in BOL graph 802A, $I_{ON}$ and $I_{OFF}$ current distributions 804B, 806B in EOL graph 802B may also comprise normal distributions, skewed distributions, etc. having respective means, ranges, variances/standard deviations, and the like. However, EOL $I_{ON}$ and $I_{OFF}$ current distributions 804B, 806B may shift to lower values and/or may have different statistical properties compared to BOL $I_{ON}$ and $I_{OFF}$ current distributions 804A, 806A. For example, EOL $I_{ON}$ and $I_{OFF}$ current distributions 804B, 806B may have smaller ranges, lower means, smaller standard deviations than BOL $I_{ON}$ and $I_{OFF}$ current distributions 804A, 806A. Further, EOL current gap 810B may also be smaller than BOL current gap 810A, or even become negative (e.g., where EOL $I_{ON}$ and $I_{OFF}$ current distributions 804B, 806B overlap). Regardless of the shifting and/or shrinking of EOL $I_{ON}$ and $I_{OFF}$ current distributions 804B, 806B and EOL current gap 810B, a reference current generator of the present disclosure may be configured to generate an $I_{REF}$ that tracks the read performance of the bitcells over time such that $I_{REF}$ 808B at the EOL stage may be placed generally in the middle of current gap 810B (if present) or skewed to be positioned at a value that minimizes the likelihood of false data reads in either states of the bitcells at EOL. In other words, a reference current generator may be configured to maintain the relationship $I_{OFF}<I_{REF}<I_{ON}$ throughout the lifecycle of an example NVM device according to some implementations set forth herein.

Although NVM device 100 has been exemplified with a single bitcell array 102 in the foregoing description of FIG. 1, it should be appreciated that some examples may involve different memory array layouts including multiple sectors, pages, etc., as well as variety of cell architectures and additional circuitry depending on implementation. For example, bitcell array 102 may be configured as multiple sectors, each sector having corresponding local column mux circuitry, row drive circuitry, etc., wherein a global sense amplifier (SA) block may be multiplexed to bitlines from different sectors via a global multiplex block. In some arrangements, one or more pre-decoder blocks, separate row and column decoders, charge pump circuitry, etc. may also be included in an example NVM device. In some arrangements, bitcells 104-1 to 104-P may comprise single transistor (1T) floating gate (FG) cells, multi-transistor cells (e.g., 2T cells) with wordline select devices, Erasable and Electrically Programmable Read-Only Memory (EPROM) cells, One-Time Programmable (OTP) cells, Electrically Erasable and Programmable ROM (EEPROM or E2PROM) cells, Flash memory cells, and the like. Also, some examples may involve PMOS-based bitcell architectures, NMOS-based bitcell architectures, and/or both.

It should be further appreciated that where EEPROM cell architectures are implemented, there may be several ways to effectuate erase and program operations depending on implementation. For example, in one arrangement, programming and erasing may be performed one bitcell (or, bit) in a row/wordline at a time. In another arrangement, programming and erasing may be performed for a portion or set of bitcells in a row/wordline at a time (e.g., a partial program/erase (P/E) operation). In another arrangement, an example architecture may involve erasing one row/wordline and programming a portion of the bitcells in the row/wordline (e.g., a partial programming operation). In yet another arrangement, an example architecture may involve erasing one sector and programming a portion of bitcells in a row of the sector. Example implementations may therefore be practiced in a variety of NVM applications regardless of the cell architectures, P/E schemes, etc., with suitable modifications to a programmable self-tracking reference current generation design applied accordingly.

Additional details with respect to a programmable $I_{REF}$ design according to some examples of the present disclosure are set forth immediately below.

Figure 2A:
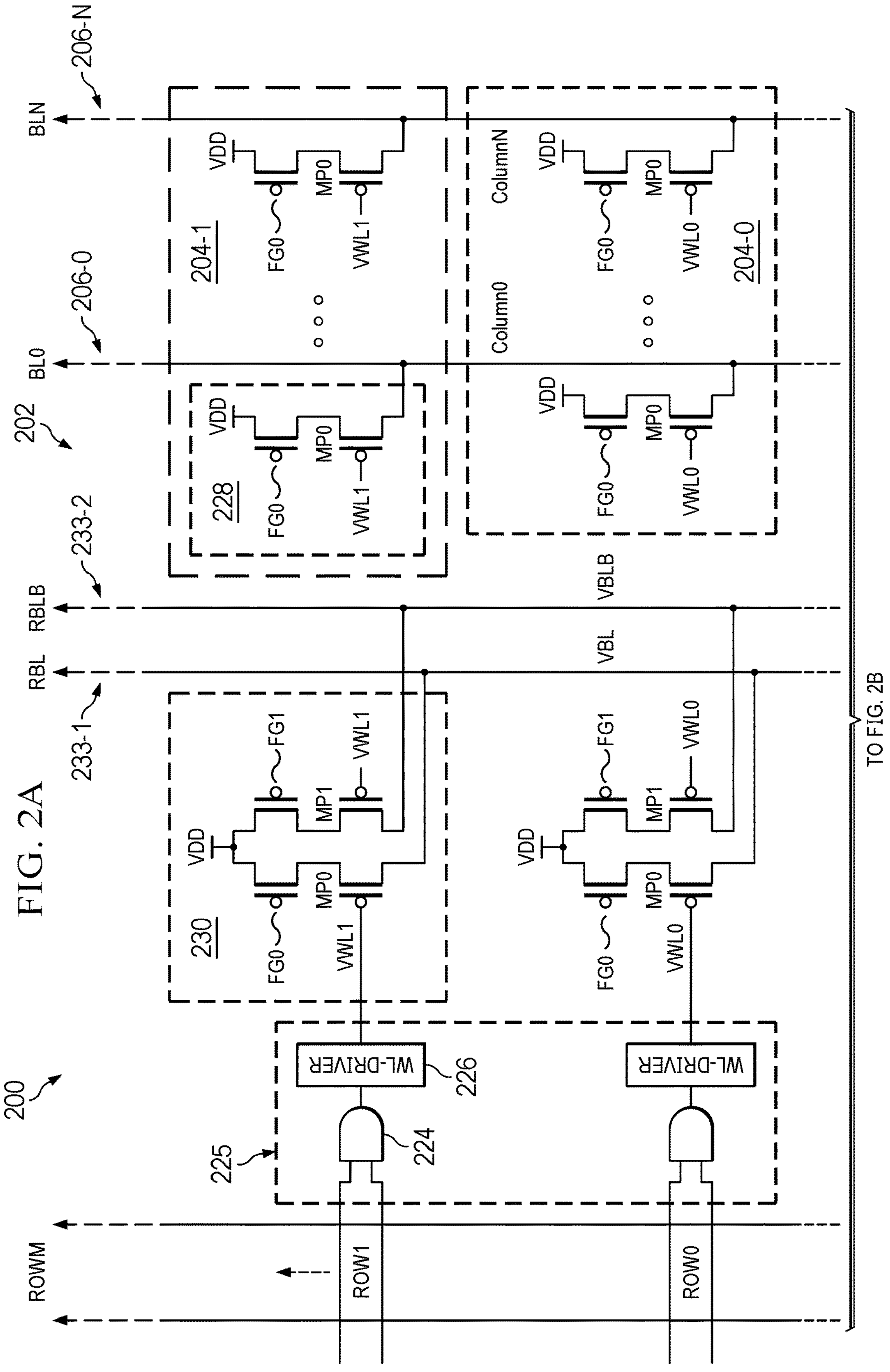
FIGS. 2A and 2B depicts a block diagram of an IC device having PMOS-based EEPROM architecture including a programmable, self-tracking $I_{REF}$ generation scheme according to some examples of the present disclosure.
Figure 2B:
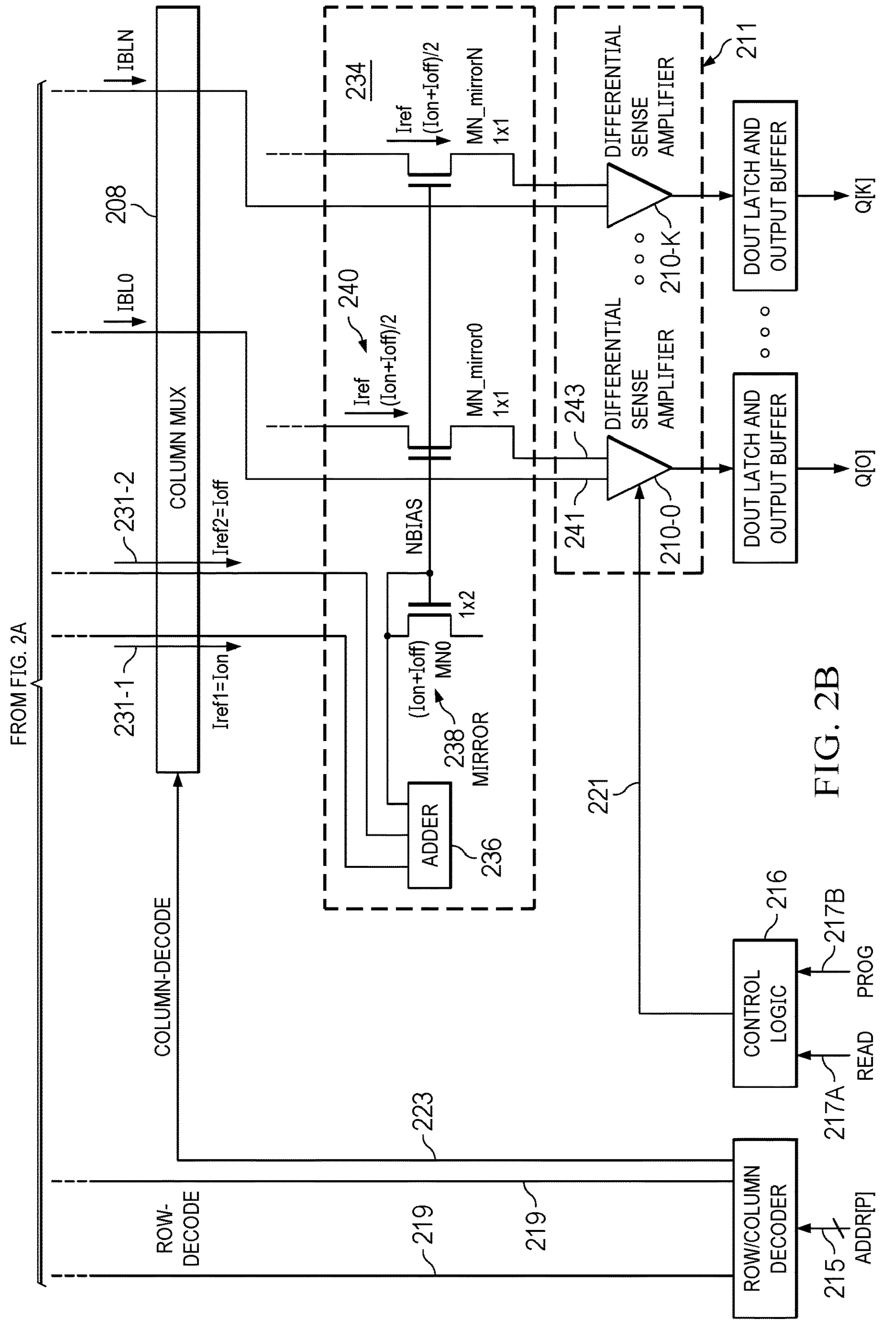

Turning now to FIGS. 2A and 2B, depicted therein is a block diagram of an integrated circuit (IC) device 200 having a PMOS-based EEPROM architecture that includes a programmable, self-tracking $I_{REF}$ generator according to some examples of the present disclosure. In one arrangement, IC device 200 comprises a plurality of PMOS bitcells organized into an array 202 of (M+1) rows of wordlines, e.g., wordlines 204-0, 204-1, . . . , and (N+1) columns of bitlines 206-0, 206-1, . . . , wherein PMOS bitcell 228 is a representative bitcell described in detail further below in reference to FIG. 3. Analogous to the architecture of NVM device 100 shown in FIG. 1, IC device 200 may include a column mux block 208 for facilitating coupling between bitlines 206-*i* (i=0, 1, . . . , N) and a sense amplifier (SA) block 211 comprising a plurality of sense amplifiers 210-0 to 210-K, each sense amplifier configured to drive a corresponding data output and latch buffer 212-0 to 212-K for outputting data bits, or read bit values, e.g., Q[0:K]. A row/column address decoder 214 is operable to decode an address signal ADDR[0:P] 215 to generate a plurality of row address signals 219 and a plurality of column address signals 223 with respect to accessing one or more bitcells of array 202 for performing erase/program/read operations. A control logic block 216 is operable responsive to control signals, e.g., read control signal 217A, program control signal 217B, etc., for appropriately configuring selected sense amplifier circuitry with respect to various memory operations by driving suitable signals 221. A row/wordline drive logic block 225 is operable responsive to row address signals 219 for driving a selected wordline to a suitable logic level in order to effectuate appropriate memory operations with respect to selected bitcells, wherein each wordline may be selectively activated by a respective driver block corresponding thereto. By way of illustration, bitcells of wordline 204-1 may be activated by a control signal VWL1 generated by a wordline driver 226 responsive to an output from AND gate 224, wherein control signal VWL1 having a suitable logic level may be commonly provided to the gates of wordline select devices of the bitcells.

Figure 3:
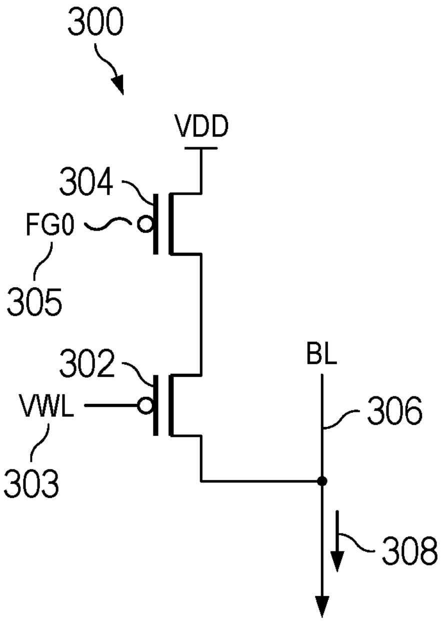
FIG. 3 depicts a representative PMOS memory cell according to an example implementation.

As shown in FIG. 3, an example bitcell 300 may comprise a PMOS FG storage device 304 coupled in series with a PMOS wordline (WL) select device 302 having a gate driven by a VWL signal 303 generated by a corresponding row driver. In a read cycle, a suitable voltage 305 may be applied to the control gate of FG storage device 304 while WL select device 302 is turned on by VWL signal 303 in response to appropriate decoding operations, whereupon FG storage device 304 may drive an $I_{ON}$ or $I_{OFF}$ read current depending on the logic state of FG storage device 304. A bitline (BL) 306 coupled to WL select device 302 of bitcell 300 is operable to direct or provide the resulting read current, exemplified as IBL 308 in FIG. 3, to a sense amplifier for reading the data based on a reference current that may be generated responsive to a PMOS-based $I_{REF}$ scheme as will be set forth further below.

Figure 4:
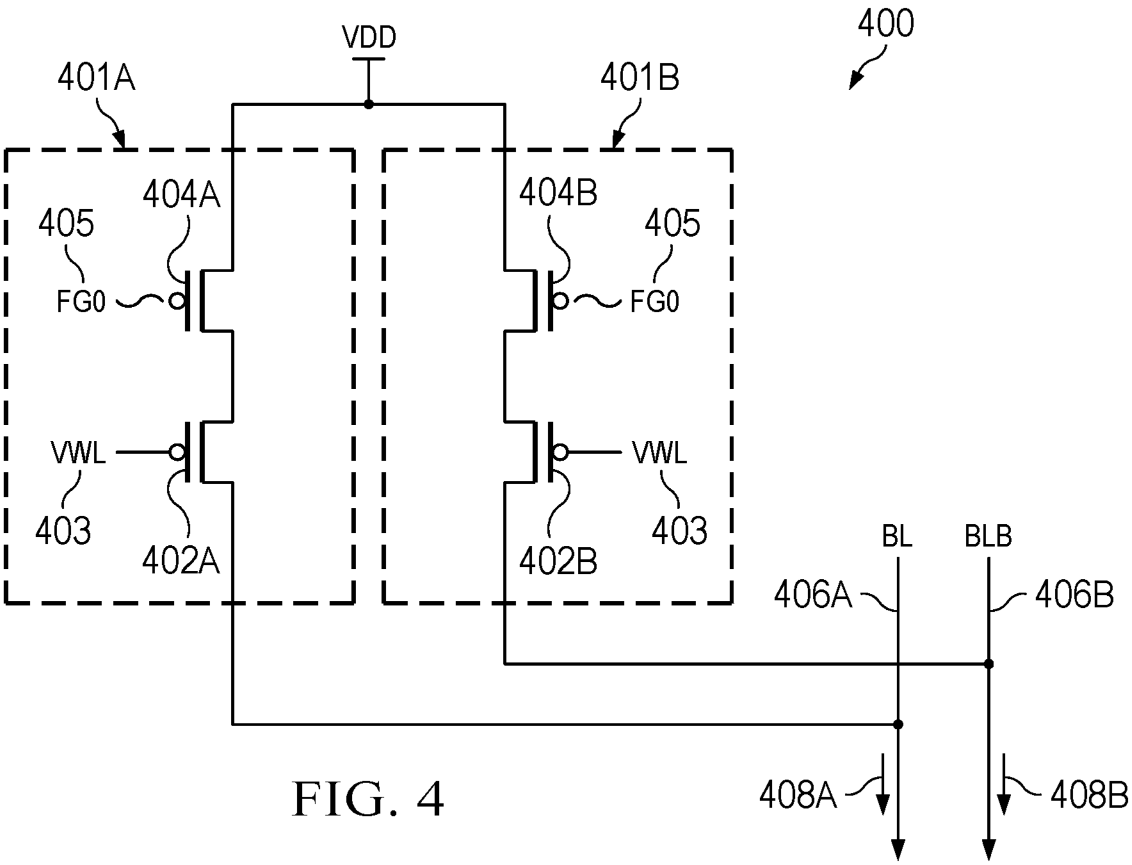
FIG. 4 depicts a representative differential reference cell having a pair of reference memory cells according to an example implementation.

In one example arrangement, a plurality of PMOS-based DRCs, each comprising a pair of PMOS reference memory cells, may be provided as part of array 202, wherein each DRC is associated with a respective wordline and configured to be actuated by corresponding row driver logic circuitry. By way of illustration, DRC 230 is associated with wordline 204-1, which may be activated by control signal VWL1 generated by wordline driver 226 responsive to row address decoding. As shown in FIG. 4, an example DRC 400 may include a first reference memory cell 401A and a second reference memory cell 401B, which may be fabricated in the same process flow stages as the array bitcells of a corresponding row with which DRC 400 may be associated, wherein the process flow stages may include deposition, etching, implantation, photolithography, annealing, and/or other suitable processes depending on NVM architecture and implementation. Identical to the array bitcells, reference memory cells 401A, 401B may each comprise a PMOS WL select device coupled in series with a PMOS FG storage device. As exemplified, reference memory cell 401A comprises WL select device 402A coupled to FG device 404A and reference memory cell 401B comprises WL select device 402B coupled to FG device 404B, wherein the gates of WL select devices 402A, 402B are commonly activated by VWL signal 403 that is also configured to activate the array bitcells of the corresponding wordline. During a read cycle, a suitable voltage 405 may be applied to the control gates of FG devices 404A, 404B while WL select devices 402A, 402B are turned on by VWL signal 403 in response to appropriate decoding operations. Depending on the respective states of FG devices 404A, 404B (e.g., programmed or unprogrammed), FG devices 404A, 404B may drive a respective reference current on a corresponding reference bitline 406A, 406B to which corresponding reference memory cells 401A, 401B are coupled. By way of example, a first reference current $I_{REF}$1 408A and a second reference current $I_{REF}$2 408B are generated by reference memory cells 401A, 401B, respectively, which are generally analogous to reference currents 231-1, 231-2 driven on reference bitline RBL 233-1 having voltage VBL and reference bitline RBLB 233-2 having voltage VBLB as shown in FIGS. 2A and 2B.

In an example arrangement, first reference memory cell 401A of each DRC cell may be configured to be in a programmed state whereas second reference memory cell 401B of each DRC cell may be configured to be in an unprogrammed state over the lifecycle of IC device 200. In another example arrangement, it may be the opposite, i.e., first reference memory cell 401A of each DRC cell may be configured to be in an unprogrammed state whereas second reference memory cell 401B of each DRC cell may be configured to be in a programmed state over the lifecycle of IC device 200. In another example arrangement, the states of first and second reference memory cells 401A, 401B of the DRC cells may be dynamically programmed to alternate between the states over the life of IC device 200. For example, the states of first and second reference memory cells 401A, 401B may alternate between the programmed and unprogrammed states (or, vice versa) for a set number of erase/program/read cycles (e.g., for every cycle, every other cycle, etc.) in order to "average out" any operational differences and/or performance drift that may develop between first and second reference memory cells 401A, 401B. In one arrangement, alternating the states of first and second reference memory cells 401A, 401B for each erase/program cycle may be effectuated to ensure that the plurality of DRCs experience the same number of erase/program cycles as the array bitcells, which can help increase the likelihood of obtaining better tracking/matching between the operational conditions of the array bitcells and the DRCs over the life cycle of IC device 200.

Regardless of whether the states of first and second reference memory cells 401A, 401B of a DRC are configured to alternate, resulting reference currents in a read cycle may comprise an ON reference current $I_{ON-REF}$ (generated by a PMOS reference memory cell in a programmed state) and an OFF reference current $I_{OFF-REF}$ (generated by a PMOS reference memory cell in an unprogrammed/erased state). Accordingly, in the example arrangement shown in FIGS. 2A and 2B, reference currents 231-1, 231-2 can be $I_{ON-REF}$ and $I_{OFF-REF}$ currents, respectively, or vice versa.

Figure 5A:
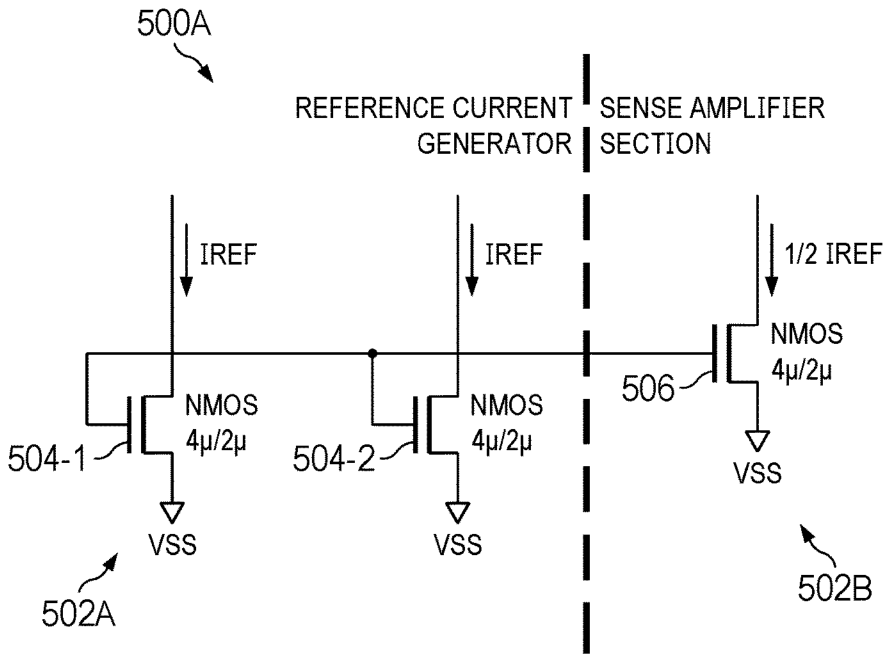
FIGS. 5A and 5B depict example current mirror arrangements according to some implementations of the present disclosure.
Figure 5B:
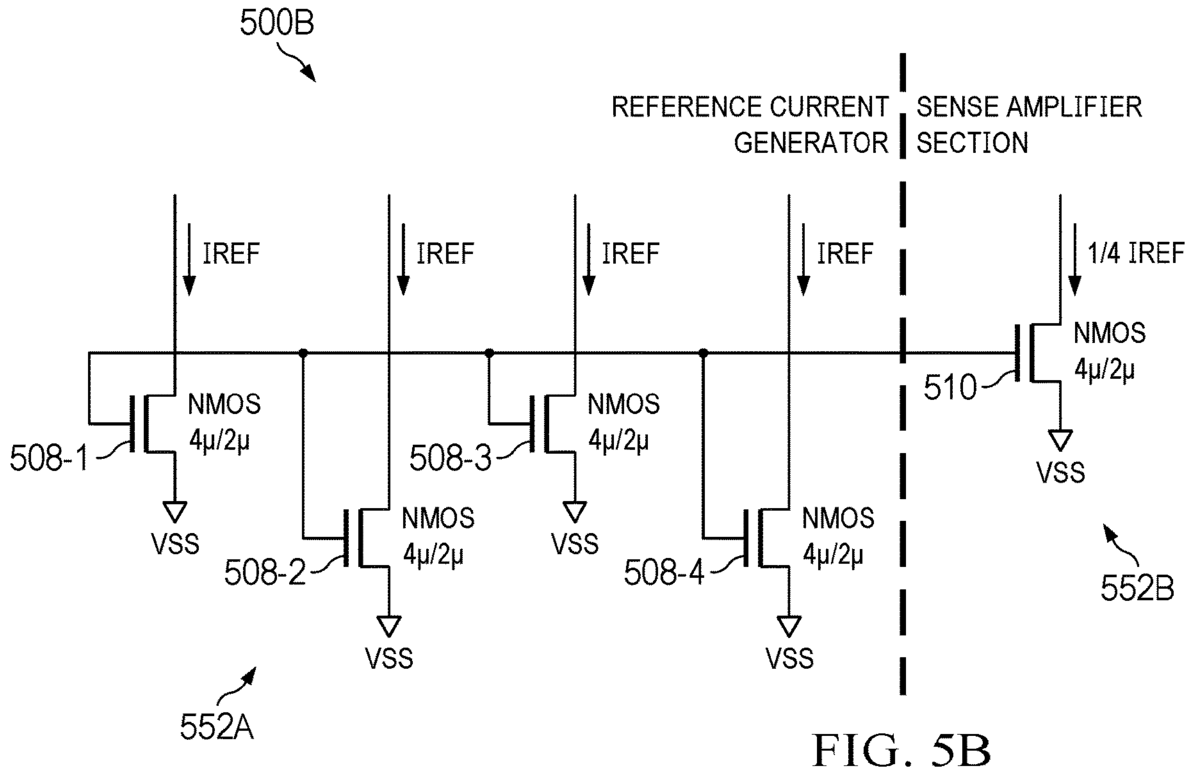

In an example arrangement, a reference current generator 234 is operable to receive reference currents 231-1, 231-2 from a selected DRC via BL 233-1 and complementary BLB 233-2 during a read cycle. Analogous to reference current generator 124 shown in FIG. 1, reference current generator 234 may be configured to provide a ratio of a total reference current (where $I_{TOTAL}=I_{ON-REF}+I_{OFF-REF}$) as a reference current to a sense amplifier associated with a bitline selected during the read cycle. Similar to the description set forth above in reference to FIG. 1, reference current generator 234 may be implemented in myriad ways using any combination of known and/or heretofore unknown current adder/divider circuitry and current mirroring circuitry to obtain a scalable fraction less than unity (1) of $I_{TOTAL}$ as a self-tracking reference current in a differential sense amplifier sensing design as exemplified by SA block 211. In one example, reference currents 231-1, 231-2 may be provided to a current adder 236 to generate $I_{TOTAL}$ that may be provided to a ratioed current mirror circuit 238 configured to generate half of $I_{TOTAL}$ on a corresponding mirroring branch coupled one of the inputs of a selected sense amplifier, wherein the other input of the selected sense amplifier may be driven by a corresponding bitline. By way of illustration, mirroring branch 240 of current mirror circuit 238 is operable to drive a reference current of ½ ($I_{TOTAL}$) to input 243 of sense amplifier 210-1 whereas input 241 is driven by bitline current (IBL0) provided via bitline 206-0. In another example, reference currents 231-1, 231-2 may be processed separately to generate respective half currents initially, e.g., ½ ($I_{ON-REF}$) and ½ ($I_{OFF-REF}$), which may be summed and mirrored on a mirroring branch coupled to the selected sense amplifier. In some example analog designs, matching devices may be used, e.g., having identical transistor lengths (L) and widths (W), to achieve a 1:1 ratio (i.e., the output current mirroring the input current), or a scaled W in the mirroring branch device to achieve an output current that is a ratio of the input current. In some example designs, multiple fingers comprising identical devices may be deployed on the input side of a current mirror circuit to achieve a desirable ratio in the mirroring branch of the output side comprising a matching device. FIGS. 5A and 5B depict examples of multi-finger current mirror arrangements wherein 2-finger and 4-finger deployments are illustrated, respectively, for achieving output currents of ½ ($I_{REF}$) and ¼ ($I_{REF}$) according to some implementations. Current mirror 500A shown in FIG. 5A comprises an input side 502A having two NMOS devices 504-1, 504-2 that are identical to an output NMOS device 506 (e.g., all devices having the same W/L ratio, illustratively, 4 μm/2 μm), wherein NMOS device 506 may be deployed as a mirroring branch in an output side 502A disposed in a sense amplifier section, NMOS device 506 operative to drive an output current of ½ ($I_{REF}$) to a selected sense amplifier. In similar fashion, current mirror 500B shown in FIG. 5B comprises an input side 552A including four NMOS devices 508-1 to 508-4 that each have the same W/L dimensions as an output NMOS device 510 (e.g., all devices having identical W/L ratios; illustratively 4 μm/2 μm), wherein NMOS device 510 may be deployed as a mirroring branch in an output section 552B operable to drive an output current of ¼ ($I_{REF}$) to a selected sense amplifier. Skilled artisans will recognize that in general any ratio [N:1] of input device fingers to an output device may be deployed in an example implementation to achieve a scalable reference current output that may be configured with a suitable skew optimized for facilitating better tracking with respect to data sensing operations.

Figure 6A:
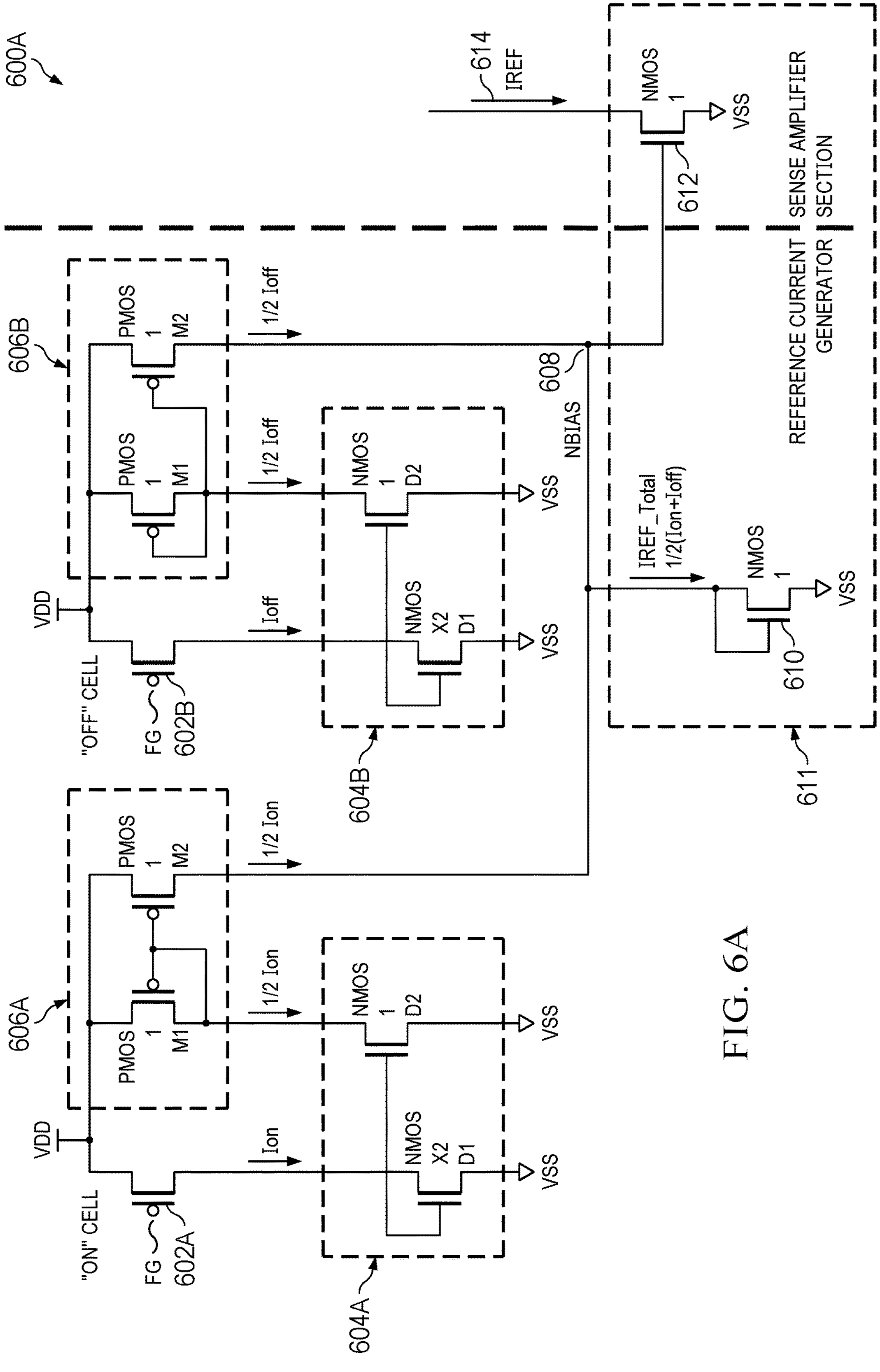
FIGS. 6A and 6B depict example reference current generators according to some implementations of the present disclosure.
Figure 6B:
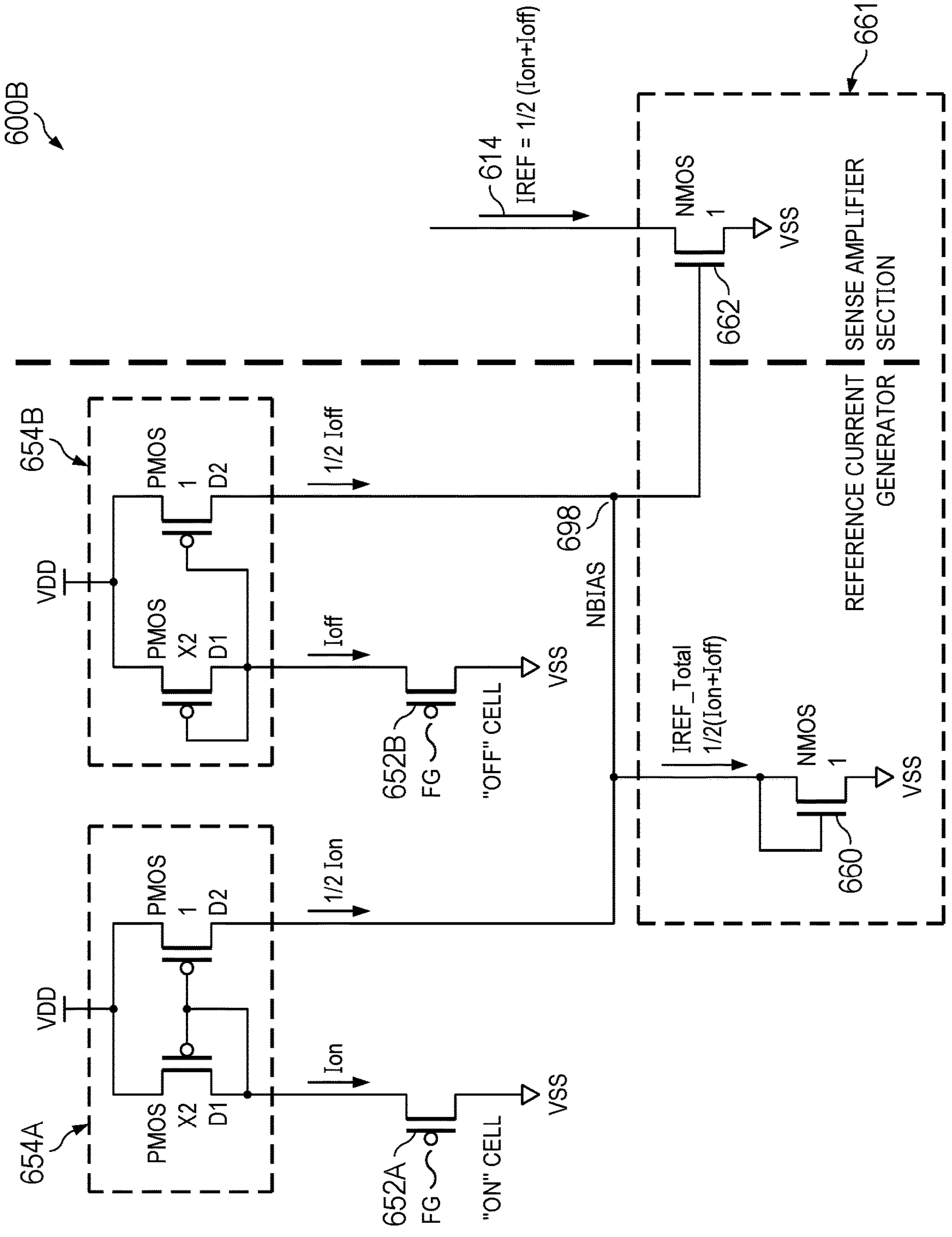

In some arrangements, current mirrors having various permutations and/or combinations of multi-finger deployments may be implemented in one or more stages with respect to the $I_{ON-REF}$ and $I_{OFF-REF}$ currents driven by a DRC in order to generate a final $I_{REF}$ current that is a scalable fraction of the total reference current. FIGS. 6A and 6B depict example reference current generators that may be deployed in association with PMOS-based and NMOS-based DRC arrangements, respectively, according to some implementations. Example arrangement 600A shown in FIG. 6A is operable with a PMOS-based DRC including a first reference memory cell 602A (representatively designated as "ON" cell) and a second reference memory cell 602B (representatively designated as "OFF" cell), wherein only respective PMOS FG storage devices are illustrated for the sake of clarity (i.e., no WL select devices are shown this FIG.). A current mirror 604A having a [2:1] ratio (e.g., based on the ratio of two NMOS devices (D1) to one output NMOS device (D2)) is operable as a divider to divide $I_{ON}$ current to provide an output of ½ ($I_{ON}$), which is then mirrored by a [1:1] current mirror 606A using identical PMOS devices M1 and M2. In similar fashion, a current mirror 604B is operable as a divider to divide $I_{OFF}$ current to provide an output of ½ ($I_{OFF}$) that is mirrored by a [1:1] current mirror 606B using identical PMOS devices M1 and M2. Both ½ ($I_{ON}$) and ½ ($I_{OFF}$) currents are provided to a node (NBIAS) 608 to generate a sum of currents that is mirrored by a [1:1] NMOS-based current mirror 611 comprising an input device 610 (e.g., disposed in the reference current generator section of an NVM device) and an output device 612 (e.g., operating as the mirroring branch disposed in a sense amplifier section of the NVM device). In one implementation, output device 612 is operable to provide a reference current ($I_{REF}$) 614 that is equal to (½ ($I_{ON}$)+½ ($I_{OFF}$)) to a selected SA of the NVM device because of the [1:1] ratio of current mirror 611.

Example arrangement 600B shown in FIG. 6B is operable with an NMOS-based bitcell array. A first reference memory cell 652A (representatively designated as "ON" cell) and a second reference memory cell 652B (representatively designated as "OFF" cell) are operative as an NMOS-based DRC, wherein only respective NMOS FG storage devices are illustrated for the sake of clarity (i.e., no WL select devices are shown this FIG.). A current mirror 654A having a [2:1] ratio (e.g., based on the ratio of two PMOS devices (D1) to one output PMOS device (D2)) is operable as a divider to divide $I_{ON}$ current to provide an output of ½ ($I_{ON}$). In similar fashion, a current mirror 654B is operable as a divider to divide $I_{OFF}$ current to provide an output of ½ ($I_{OFF}$). Both ½ ($I_{ON}$) and ½ ($I_{OFF}$) currents are provided to a node (NBIAS) 658 to generate a sum of currents that is mirrored by a [1:1] NMOS-based current mirror 661 comprising an input device 660 (e.g., disposed in the reference current generator section of an NVM device) and an output device 662 (e.g., operating as the mirroring branch disposed in an SA section of the NVM device). Because of the [1:1] ratio of current mirror 661, output device 662 is operable to provide a reference current ($I_{REF}$) 664 that is equal to (½ ($I_{ON}$)+½ ($I_{OFF}$)) to a selected SA of the NVM device in an example implementation.

It will be appreciated that some examples may therefore include more than one current mirror circuit as part a reference current generator wherein some of the mirroring circuits may be configured as current dividers. Regardless of the exact implementation, the term "current mirror block" as used herein may include various permutations and/or combinations of current mirror/divider circuits to generate an output reference current having a desired ratio with respect to an input current that is a combination of ON and OFF currents as described in the present disclosure.

Figure 7A:
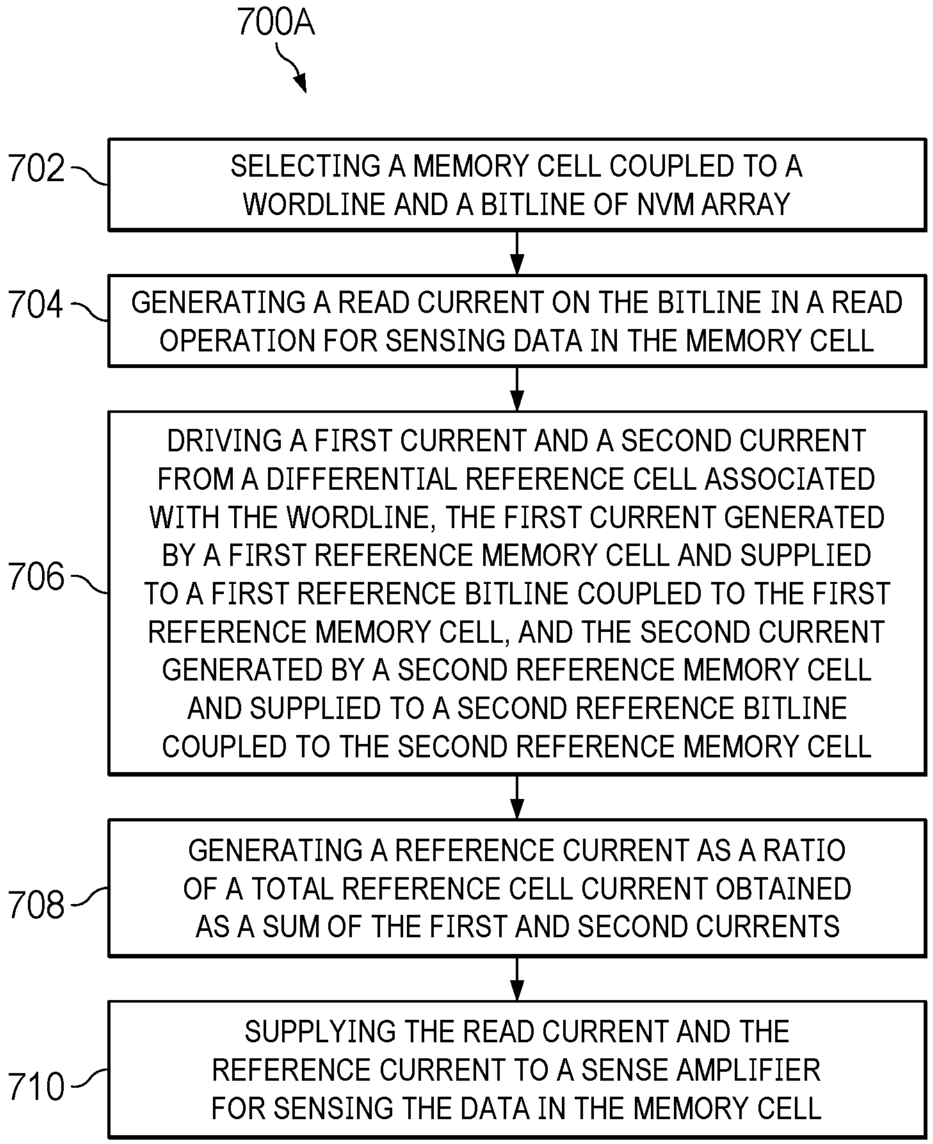
FIGS. 7A and 7B are flowcharts of example methods of the present disclosure.
Figure 7B:
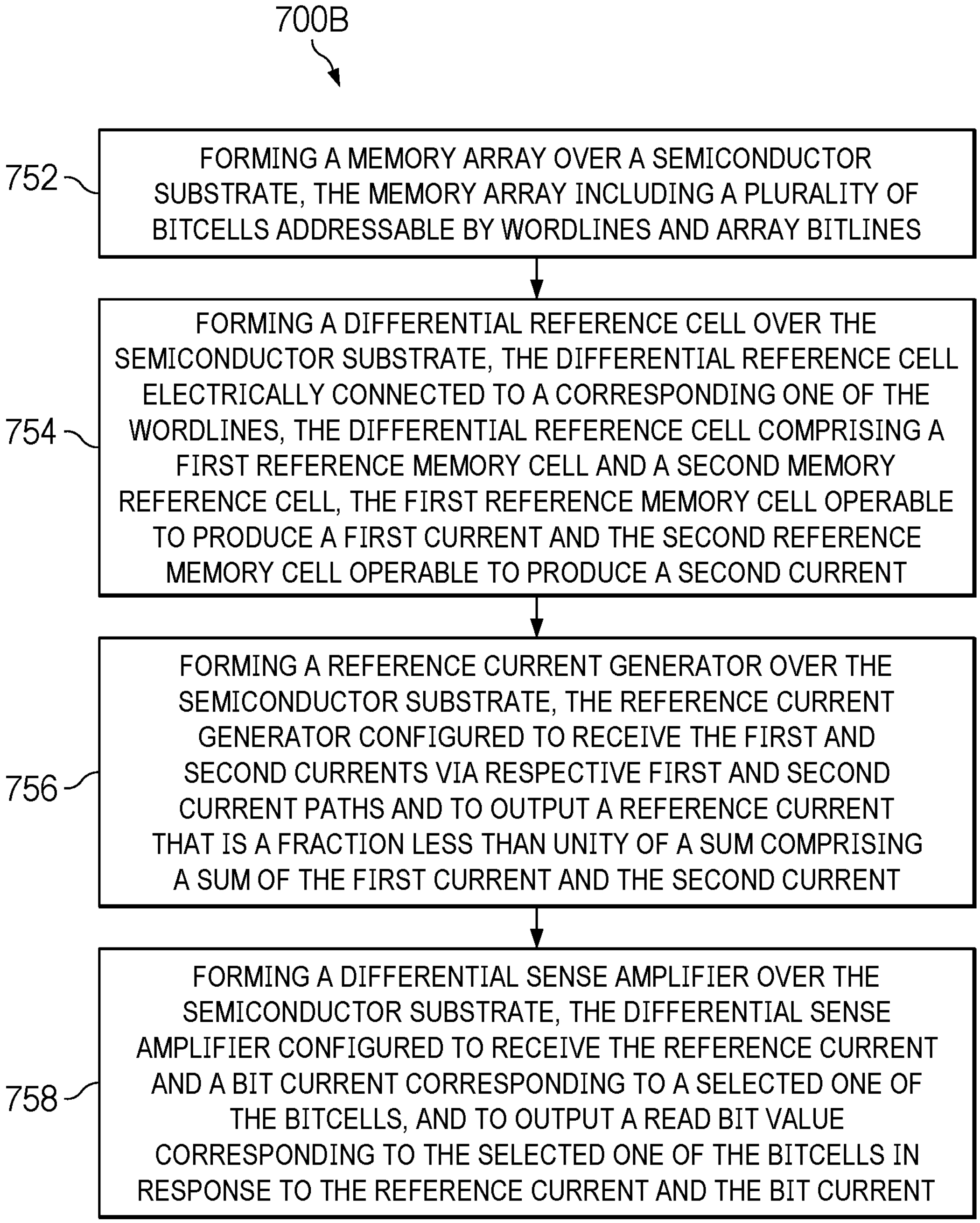

FIGS. 7A and 7B are flowcharts of example methods of the present disclosure according to some implementations. Process flow 700A is directed to effectuating memory read operations in an IC device having an NVM array according to an example. At block 702, a memory cell coupled to a wordline and a bitline of the NVM array may be selected, e.g., responsive to suitable decoding operations. At block 704, a read current may be generated on the bitline in a read operation for sensing data in the memory cell. At block 706, a first current and a second current may be driven by a differential reference cell associated with the wordline, wherein the first current may be generated by a first reference memory cell and supplied to a first reference bitline coupled to the first reference memory cell, and wherein the second current may be generated by a second reference memory cell and supplied to a second reference bitline coupled to the second reference memory cell. At block 708, a reference current may be generated as a ratio or fraction of a total reference cell current that is obtained as a sum of the first and second currents. At block 710, the read current driven by the selected memory cell and the reference current may be provided to a sense amplifier for sensing the data in the memory cell.

Process flow 700B shown in FIG. 7B is directed to a method of fabricating an IC device including a nonvolatile memory according to an example. At block 752, a memory array including a plurality of bitcells may be formed over a semiconductor substrate (e.g., a wafer comprising Si, Ge, GaAs, SiC, other Group III-V materials, polysilicon, doped Si, etc.), wherein the plurality of bitcells are addressable by wordlines and array bitlines. At block 754, a differential reference cell may be formed over the semiconductor substrate, the differential reference cell electrically connected to a corresponding one of the wordlines, the differential reference cell comprising a first reference memory cell and a second memory reference cell, wherein the first reference memory cell is operable to produce a first current and the second reference memory cell is operable to produce a second current. In one arrangement, the differential reference cell and the bitcells connected to the corresponding wordline may be formed in the same fabrication operation (e.g., contemporaneously fabricated in the same process flow stages, as previously noted). At block 756, a reference current generator may be formed over the semiconductor substrate, the reference current generator configured to receive the first and second currents via respective first and second current paths and to output a reference current that is a fraction less than unity of a sum comprising a sum of the first current and the second current. At block 758, a differential sense amplifier may be formed over the semiconductor substrate, the differential sense amplifier configured to receive the reference current and a bit current corresponding to a selected one of the bitcells, and to output a read bit value corresponding to the selected one of the bitcells in response to the reference current and the bit current.

Although some examples including a PMOS-based NVM architecture have been set forth in particular detail above, it should be appreciated that the teachings herein are not necessarily limited thereto. Some examples may therefore include NVM architectures based on NMOS and/or CMOS technologies wherein a suitable DRC arrangement may be provided for generating a self-tracking $I_{REF}$ according to an implementation. Additionally, whereas a representative DRC is exemplified as having two reference cells, one in programmed state and the other in unprogrammed state (which in some arrangements is an erased state because an erase operation may be performed prior to programming), some examples may involve an $I_{REF}$ design wherein a DRC may comprise more than two reference cells, with a first portion of reference cells in one electrical state and a second portion of reference cells in another electrical state. Furthermore, the electrical states of the first and second portion of reference cells may be dynamically alternated in some implementations similar to the 2-cell DRC arrangements.

At least some examples are described herein with reference to one or more block diagrams and/or flowchart illustrations. It is understood that such diagrams and/or flowchart illustrations, and combinations of blocks in the block diagrams and/or flowchart illustrations, are susceptible to various modifications, variations and alterations, etc. In at least some additional or alternative implementations, the functions/acts described in the blocks may occur out of the order shown in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Also, some blocks in the flowcharts may be optionally omitted. Furthermore, although some of the diagrams include arrows on communication paths to show a primary direction of communication, it is to be understood that communication may occur in the opposite direction relative to the depicted arrows. Finally, other blocks may be added/inserted between the blocks that are illustrated.

It should therefore be clearly understood that the order or sequence of the acts, steps, functions, components or blocks illustrated in any of the flowcharts and/or block diagrams depicted in the drawing Figures of the present disclosure may be modified, altered, replaced, customized or otherwise rearranged within a particular flowchart or block diagram, including deletion or omission of a particular act, step, function, component or block. Moreover, the acts, steps, functions, components or blocks illustrated in a particular flowchart may be inter-mixed or otherwise inter-arranged or rearranged with the acts, steps, functions, components or blocks illustrated in another flowchart in order to effectuate additional variations, modifications and configurations with respect to one or more processes for purposes of practicing the teachings of the present disclosure.

Accordingly, although various implementations have been shown and described in detail, the claims are not limited to any particular implementation or example. None of the above Detailed Description should be read as implying that any particular component, element, step, act, or function is essential such that it must be included in the scope of the claims. Where the phrases such as "at least one of A and B" or phrases of similar import are recited or described, such a phrase should be understood to mean "only A, only B, or both A and B." Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the claims appended below.

What is claimed is:

1. An integrated circuit, comprising:

a memory array including a first plurality of bitcells addressable by a first wordline and array bitlines;

a differential reference cell addressable by the first wordline, the differential reference cell comprising a first reference memory cell and a second reference memory cell, the first reference memory cell operable to produce a first current and the second reference memory cell operable to produce a second current;

a reference current generator configured to receive the first and second currents via respective first and second current paths and to output a reference current that is a fraction less than unity of a sum of the first current and the second current; and a differential sense amplifier configured to receive the reference current and a bit current corresponding to a selected one of the first plurality of bitcells, and to output a read bit value corresponding to the selected one of the first plurality of bitcells in response to the reference current and the bit current.

2. The integrated circuit as recited in claim 1, wherein the first and second currents are generated based on respective logic states of the first and second reference memory cells of the differential reference cell.

3. The integrated circuit as recited in claim 1, wherein the reference current generator is configured to output the reference current as approximately one-half of the sum of the first current and the second current.

4. The integrated circuit as recited in claim 1, wherein the differential reference cell is a first differential reference cell, the integrated circuit further comprising:

a second plurality of bitcells addressable by a second wordline and the array bitlines; and a second differential reference cell addressable by the second wordline, the second differential reference cell including a third reference memory cell and a fourth reference memory cell, the third reference memory cell operable to produce a third current and the fourth reference memory cell operable to produce a fourth current.

5. The integrated circuit as recited in claim 1, wherein the first plurality of bitcells and the differential reference cell are formed from NMOS devices.

6. The integrated circuit as recited in claim 1, wherein the first plurality of bitcells and the first and second reference memory cells each comprise a corresponding floating gate storage device coupled in series with a wordline select device.

7. The integrated circuit as recited in claim 2, wherein the first and second reference memory cells of the differential reference cell are configured to alternate between the respective logic states for each erase and program cycle applied to at least a proper subset of the first plurality of bitcells that are connected to the first wordline.

8. A nonvolatile memory, comprising:

a plurality of memory cells organized into M wordlines and N array bitlines;

a plurality of differential reference cells, each differential reference cell of the plurality of differential reference cells is addressable by a different one of the M wordlines of the plurality of memory cells, wherein each differential reference cell comprises a first reference memory cell and a second reference memory cell, each first reference memory cell electrically connected to a first reference bitline and each second reference memory cell electrically connected to a second reference bitline;

a plurality of differential sense amplifiers each configured to receive an electrical signal corresponding to a corresponding one of the array bitlines; and a reference current generator coupled to the first and second reference bitlines, the reference current generator configured to direct a reference current to the differential sense amplifiers.

9. The nonvolatile memory as recited in claim 8, wherein the reference current generator comprises a current mirror block configured to generate a scalable ratio of a total current from a differential reference cell of the plurality of differential reference cells as the reference current, the total current comprising a sum of a first current generated on the first reference bitline and a second current generated on the second reference bitline, the first and second currents based on respective logic states of the first and second reference memory cells.

10. The nonvolatile memory as recited in claim 9, wherein the current mirror block comprises a current divider for providing the reference current as approximately half of the total current.

11. The nonvolatile memory as recited in claim 9, wherein the first and second reference memory cells of the differential reference cell are configured to alternate between the respective logic states for each erase and program cycle applied to at least a portion of memory cells of a wordline associated with the differential reference cell.

12. A method of fabricating an IC device including a nonvolatile memory, the method comprising:

forming a memory array over a semiconductor substrate, the memory array including a plurality of bitcells addressable by wordlines and array bitlines;

forming a plurality of differential reference cells over the semiconductor substrate, each differential reference cell of the plurality of differential reference cells electrically connected to a different one of the wordlines of the memory array, a differential reference cell of the plurality of differential reference cells comprising a first reference memory cell and a second reference memory cell, the first reference memory cell operable to produce a first current and the second reference memory cell operable to produce a second current;

forming a reference current generator over the semiconductor substrate, the reference current generator configured to receive the first and second currents via respective first and second current paths and to output a reference current that is a fraction less than unity of a sum of the first current and the second current; and forming a differential sense amplifier over the semiconductor substrate, the differential sense amplifier configured to receive the reference current and a bit current corresponding to a selected one of the plurality of bitcells, and to output a read bit value corresponding to the selected one of the plurality of bitcells in response to the reference current and the bit current.

13. The method as recited in claim 12, wherein the reference current generator is formed to include a current mirror block configured to output the reference current as one-half of the sum of the first current and the second current.

14. The method as recited in claim 12, wherein the plurality of bitcells and the plurality of differential reference cells are formed from PMOS devices.

15. The method as recited in claim 12, wherein the plurality of bitcells and the plurality of differential reference cells are formed from NMOS devices.

16. The method as recited in claim 12, wherein the plurality of bitcells and the first and second reference memory cells are each formed to comprise a corresponding floating gate storage device coupled in series with a wordline select device.

17. The method as recited in claim 12, wherein each differential reference cell of the plurality of differential reference cells is formed to include the first and second reference memory cells operable to alternate between programmed and unprogrammed states for each erase and program cycle applied to at least a proper subset of the plurality of the bitcells that are connected to the corresponding one of the wordlines.

18. The method as recited in claim 17, wherein the first and second reference memory cells and the bitcells of the plurality of bitcells connected to the corresponding wordline are formed contemporaneously in a same fabrication operation.

19. The integrated circuit as recited in claim 2, wherein:

the first reference memory cell is configured to transition from a first logic state to a second logic state after an erase and program cycle; and the second reference memory cell is configured to transition from the second logic state to the first logic state after the erase and program cycle.

20. The integrated circuit as recited in claim 1, wherein the differential sense amplifier is a first differential sense amplifier, the selected one of the first plurality of bitcells is a first bitcell, the bit current is a first bit current, and the read bit value is a first read bit value, the integrated circuit further comprising:

a second differential sense amplifier configured to receive the reference current and a second bit current corresponding to a second bitcell of the first plurality of bitcells and to output a second read bit value corresponding to the second bitcell in response to the reference current and the second bit current.

* * * * *